United States Patent
Couture et al.

(10) Patent No.: US 9,935,152 B2
(45) Date of Patent: Apr. 3, 2018

(54) X-RAY DETECTOR HAVING IMPROVED NOISE PERFORMANCE

(71) Applicant: General Electric Company, Schenectady, NY (US)

(72) Inventors: Aaron Judy Couture, Niskayuna, NY (US); Gautam Parthasarathy, Niskayuna, NY (US); Jie Jerry Liu, Niskayuna, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 30 days.

(21) Appl. No.: 13/728,052

(22) Filed: Dec. 27, 2012

(65) Prior Publication Data

US 2014/0183675 A1 Jul. 3, 2014

(51) Int. Cl.
*H01L 27/146* (2006.01)

(52) U.S. Cl.
CPC .. *H01L 27/14683* (2013.01); *H01L 27/14663* (2013.01); *H01L 27/14676* (2013.01); *H01L 27/14692* (2013.01)

(58) Field of Classification Search
CPC ............ H01L 27/146; H01L 27/14603; H01L 27/14636; H01L 27/14658; H01L 27/14663; H01L 27/14676
USPC ..... 257/59, 292, 444, 72, E21.019, E21.252, 257/E21.648, E21.649, E21.657, 293, 257/291; 438/253, 254, 158, 24, 30, 586, 438/59, 595, 637, 640
See application file for complete search history.

(56) References Cited

U.S. PATENT DOCUMENTS

| 5,319,206 A | 6/1994 | Lee et al. |
| 5,357,121 A | 10/1994 | Miyashita et al. |

(Continued)

FOREIGN PATENT DOCUMENTS

| CN | 101114668 A | 1/2008 |
| CN | 101718912 A | 6/2010 |

(Continued)

OTHER PUBLICATIONS

Liu et al., "An Alternate Line Erasure and Readout (ALER) Method for Implementing Slot-Scan Imaging Technique with a Flat-Panel Detector-Initial Experiences", IEEE Transactions on Medical Imaging, pp. 496-502, vol. 25, No. 4, Apr. 2006.

(Continued)

*Primary Examiner* — Jae Lee
(74) *Attorney, Agent, or Firm* — Pabitra K. Chakrabarti

(57) ABSTRACT

Exemplary embodiments are directed to imagining detectors and methods of fabricating the imagining detectors for use in medical imagining systems. In exemplary embodiments, a detector for an imaging device include a continuous unpatterned photoelectric material that forms a portion of a photosensor and an electrode disposed with respect to the photoelectric material to form an anode or cathode of the photosensor. Data readout lines connected to the outputs of transistors of the detector can be susceptible electronic noise from capacitive coupling between the electrode of the photosensor. In exemplary embodiments of the present disclosure, a lateral offset and/or vertical offset between the electrode and the data readout lines can be formed to control the capacitive coupling between the electrode and the data readout line.

11 Claims, 5 Drawing Sheets

(56) References Cited

U.S. PATENT DOCUMENTS

| | | | |
|---|---|---|---|
| 5,381,014 A | 1/1995 | Jeromin et al. | |
| 5,399,884 A | 3/1995 | Wei et al. | |
| 5,614,720 A | 3/1997 | Morgan et al. | |
| 5,721,422 A * | 2/1998 | Bird | 250/208.1 |
| 6,181,769 B1 | 1/2001 | Hoheisel et al. | |
| 6,205,199 B1 | 3/2001 | Polichar et al. | |
| 6,262,421 B1 | 7/2001 | Tran | |
| 6,303,943 B1 | 10/2001 | Yu et al. | |
| 6,341,153 B1 | 1/2002 | Rivera et al. | |
| 6,380,543 B1 | 4/2002 | Kim | |
| 6,426,991 B1 | 7/2002 | Mattson et al. | |
| 6,465,824 B1 | 10/2002 | Kwasnick et al. | |
| 6,483,099 B1 | 11/2002 | Yu et al. | |
| 6,717,150 B2 | 4/2004 | Hoffman | |
| 6,740,384 B2 | 5/2004 | Lee et al. | |
| 6,841,784 B2 | 1/2005 | Brahme et al. | |
| 6,867,418 B2 | 3/2005 | Suzuki et al. | |
| 6,901,159 B2 | 5/2005 | Baertsch et al. | |
| 6,904,124 B2 | 6/2005 | Staver et al. | |
| 6,970,586 B2 | 11/2005 | Baertsch et al. | |
| 6,982,424 B2 | 1/2006 | Vafi et al. | |
| 7,053,381 B2 | 5/2006 | Shaw et al. | |
| 7,081,627 B2 | 7/2006 | Heismann et al. | |
| 7,105,830 B2 | 9/2006 | Nagano et al. | |
| 7,122,804 B2 | 10/2006 | Mollov | |
| 7,180,075 B2 | 2/2007 | Brabec et al. | |
| 7,196,331 B2 | 3/2007 | Heismann | |
| 7,211,825 B2 | 5/2007 | Shih et al | |
| 7,259,037 B2 | 8/2007 | Shih | |
| 7,366,280 B2 | 4/2008 | Lounsberry | |
| 7,379,528 B2 | 5/2008 | Mattson et al. | |
| 7,486,766 B1 | 2/2009 | Nagarkar et al. | |
| 7,560,702 B2 | 7/2009 | Meirav et al. | |
| 7,605,875 B2 | 10/2009 | Baek et al. | |
| 7,606,346 B2 | 10/2009 | Tkaczyk et al. | |
| 7,838,994 B2 | 11/2010 | Shibayama et al. | |
| 7,897,929 B2 | 3/2011 | Albagli et al. | |
| 7,947,960 B2 | 5/2011 | Wu et al. | |
| 7,947,961 B2 | 5/2011 | Nys | |
| 7,964,903 B2 | 6/2011 | Joo et al. | |
| 8,076,647 B2 | 12/2011 | Danielsson et al. | |
| 8,084,743 B2 | 12/2011 | Saito et al. | |
| 8,120,683 B1 | 2/2012 | Tumer et al. | |
| 8,173,969 B2 | 5/2012 | Nishino et al. | |
| 8,222,158 B2 | 7/2012 | Mochizuki et al. | |
| 8,300,125 B2 | 10/2012 | Ng et al. | |
| 8,343,779 B2 | 1/2013 | Buergi et al. | |
| 8,405,832 B2 | 3/2013 | Schmaelzle et al. | |
| 8,477,125 B2 | 7/2013 | Park et al. | |
| 8,605,862 B2 | 12/2013 | Granfors et al. | |
| 2002/0079458 A1 | 6/2002 | Zur | |
| 2003/0001222 A1* | 1/2003 | Street | H01L 27/14643 257/444 |
| 2003/0010923 A1 | 1/2003 | Zur | |
| 2003/0030004 A1 | 2/2003 | Dixon et al. | |
| 2003/0031296 A1 | 2/2003 | Hoheisel | |
| 2003/0122083 A1 | 7/2003 | Possin et al. | |
| 2003/0210761 A1 | 11/2003 | Hoffman | |
| 2003/0227997 A1* | 12/2003 | Petrick et al. | 378/98.8 |
| 2003/0234364 A1* | 12/2003 | Hennessy et al. | 250/370.14 |
| 2004/0016886 A1 | 1/2004 | Ringermacher et al. | |
| 2004/0085598 A1 | 5/2004 | Kokeguchi et al. | |
| 2004/0113086 A1 | 6/2004 | Heismann et al. | |
| 2004/0170861 A1 | 9/2004 | Culligan et al. | |
| 2004/0190676 A1 | 9/2004 | Kojima et al. | |
| 2004/0229051 A1 | 11/2004 | Schaepkens et al. | |
| 2005/0008213 A1 | 1/2005 | Shankarappa et al. | |
| 2005/0178971 A1 | 8/2005 | Hoge | |
| 2005/0236614 A1 | 10/2005 | Parker | |
| 2006/0008054 A1 | 1/2006 | Ohara | |
| 2006/0256922 A1 | 11/2006 | Imai et al. | |
| 2006/0282946 A1 | 12/2006 | Meyer | |
| 2007/0039102 A1 | 2/2007 | Thompson | |
| 2007/0085015 A1 | 4/2007 | Castleberry | |
| 2007/0257253 A1 | 11/2007 | Im et al. | |
| 2007/0262266 A1 | 11/2007 | Hoheisel et al. | |
| 2007/0289625 A1 | 12/2007 | Demadrille et al. | |
| 2007/0295966 A1 | 12/2007 | Watanabe et al. | |
| 2007/0295973 A1 | 12/2007 | Jinbo et al. | |
| 2008/0078940 A1 | 4/2008 | Castleberry et al. | |
| 2008/0135891 A1 | 6/2008 | Arias et al. | |
| 2008/0149852 A1 | 6/2008 | Shoji et al. | |
| 2008/0267345 A1 | 10/2008 | Nagumo et al. | |
| 2008/0278068 A1 | 11/2008 | Huang et al. | |
| 2009/0026379 A1 | 1/2009 | Yaegashi et al. | |
| 2009/0026383 A1 | 1/2009 | Kim et al. | |
| 2009/0166512 A1 | 7/2009 | Fuerst et al. | |
| 2009/0279029 A1* | 11/2009 | Kunii et al. | 349/116 |
| 2009/0285352 A1 | 11/2009 | Schmitt | |
| 2010/0059804 A1 | 3/2010 | Hayashi et al. | |
| 2010/0102242 A1 | 4/2010 | Burr et al. | |
| 2010/0102300 A1 | 4/2010 | Burroughes et al. | |
| 2010/0148072 A1 | 6/2010 | Fuerst et al. | |
| 2010/0155578 A1 | 6/2010 | Matsumoto | |
| 2010/0193691 A1 | 8/2010 | Ishii et al. | |
| 2010/0224784 A1 | 9/2010 | Homma et al. | |
| 2010/0305427 A1 | 12/2010 | Huber et al. | |
| 2010/0320391 A1 | 12/2010 | Antonuk | |
| 2011/0024711 A1 | 2/2011 | Li et al. | |
| 2011/0026685 A1 | 2/2011 | Zilberstein et al. | |
| 2011/0042656 A1 | 2/2011 | Burroughes et al. | |
| 2011/0049661 A1 | 3/2011 | Maehara et al. | |
| 2011/0127504 A1 | 6/2011 | Halls et al. | |
| 2011/0168905 A1 | 7/2011 | Yabuta et al. | |
| 2011/0204341 A1 | 8/2011 | Brown et al. | |
| 2011/0305315 A1 | 12/2011 | Park et al. | |
| 2012/0018627 A1 | 1/2012 | Tredwell et al. | |
| 2012/0037809 A1 | 2/2012 | Levene et al. | |
| 2012/0068076 A1 | 3/2012 | Daghighian | |
| 2012/0080605 A1* | 4/2012 | Kawanabe | G01T 1/243 250/370.08 |
| 2012/0097858 A1 | 4/2012 | Morf | |
| 2012/0121067 A1 | 5/2012 | Hayden et al. | |
| 2012/0161018 A1 | 6/2012 | Shin | |
| 2012/0161270 A1* | 6/2012 | Maehara | B82Y 10/00 257/432 |
| 2012/0193542 A1 | 8/2012 | Yamada | |
| 2012/0201347 A1 | 8/2012 | Prentice et al. | |
| 2012/0201348 A1 | 8/2012 | Knight et al. | |
| 2012/0223238 A1 | 9/2012 | Stark | |
| 2012/0259378 A1 | 10/2012 | Heinrichs et al. | |
| 2012/0267535 A1 | 10/2012 | Nakatsugawa et al. | |
| 2013/0082264 A1 | 4/2013 | Couture et al. | |
| 2013/0092840 A1 | 4/2013 | Ohta et al. | |
| 2013/0140464 A1 | 6/2013 | Iwakiri et al. | |
| 2013/0140568 A1* | 6/2013 | Miyamoto | H01L 31/0248 257/53 |
| 2013/0170616 A1 | 7/2013 | Mruthyunjaya et al. | |
| 2014/0010353 A1 | 1/2014 | Lalena | |
| 2014/0014843 A1 | 1/2014 | Ikeda et al. | |
| 2014/0054442 A1 | 2/2014 | Huang et al. | |

FOREIGN PATENT DOCUMENTS

| | | |
|---|---|---|
| CN | 201681056 U | 12/2010 |
| CN | 101975787 A | 2/2011 |
| CN | 102539454 A | 7/2012 |
| CN | 202903698 U | 4/2013 |
| DE | 2520065 B1 | 7/1976 |
| DE | 10136756 A1 | 2/2003 |
| EP | 2328177 A2 | 6/2011 |
| GB | 2317742 A | 4/1998 |
| WO | 9423458 A2 | 10/1994 |
| WO | 2008148815 A1 | 12/2008 |

OTHER PUBLICATIONS

Xu et al., "Organic photodetector arrays with indium tin oxide electrodes patterned using directly transferred metal masks", Applied Physics Letters 94 from the American Institute of Physics, 2009.

(56) References Cited

OTHER PUBLICATIONS

Weisfield, et al, "Performance analysis of a 127-micron pixel large-area TFT/photodiode array with boosted fill factor", www.dpix.com/technology/Documents/, Jul. 25, 2011.
Unofficial English translation of Chinese Office Action and Search Report issued in connection with corresponding CN Application No. 201310741529.4 dated Jan. 4, 2016, 12pgs.
"Weld Inspection", GE Measurement & Control, Integrity, safety & productivity through non-destructive testing solutions from GE's Inspection Technologies business, pp. 1-40, Apr. 2012.
Zhao et al., "X-ray imaging using amorphous selenium: Feasibility of a flat panel self-scanned detector for digital radiology", Medical Physics, vol. No. 22, Issue No. 10, pp. 1595-1604, Jul. 13, 1995.
Granfors et al., "Performance of a 41×41-cm2 amorphous silicon flat panel x-ray detector for radiographic imaging applications", Medical Physics, vol. No. 27, Issue No. 06, pp. 1324-1331, Mar. 13, 2000.
Kao et al., "Fabrication of organic light-emitting devices on flexible substrates using a combined roller imprinting and photolithograph y-patterning technique, Journal of Vacuum Science & Technology B: Microelectronics and Nanometer Structures," IEEE, vol. No. 24, Issue No. 03, pp. 1278-1282, May 2006.
Greener et al., "Moisture Permeability Through Multilayered Barrier Films as Applied to Flexible OLED Display", Journal of Applied Polymer Science, vol. No. 106, Issue No, 5, pp. 3534-3542, 2007.
Ng et al., "Flexible image sensor array with bilk heterojunction organic photodiode", Applied Physics Letters, vol. No. 92, pp. 213303-1-3, 2008.
Gong et al., "High-Detectivity Polymer Photodectors with Spectral Response from 300nm to 1450nm", Science, vol. No. 325, pp. 1665-1667, 2009.
Ng et al., "Characterization of Charge Collection in Photodiodes Under Mechanical Strain: Comparison Between Organic Bulk Heterojunction and Amorphous Silicon", Advanced Materials, vol. No. 21, issue No. 18, pp. 1855-1859, 2009.
Kim et al., "Characteristic Study of Multi-layer using Hybrid Method for Digital X-ray Detector", IEEE Nuclear Science Symposium Conference Record, pp. 3327-3329, 2009.
Phoenix x/act: http://www/ge-mcs .com/download/x-ray/phoenix-x-ray/GEIT-31342EN_x-act.pdf, retrieved on Jan. 1, 2010.
Lujan et al., "Flexible X-Ray Detector Array Fabricated with Oxide Thin-Film Transistors", IEEE Electron Device Letters, vol. No. 33, Issue No. 5, pp. 688-690, May 2012.
Shorey et al., "Development of Substrates Featuring Through Glass Vias (TGV) for 3D-IC Integration",Downloaded from the internet<http://www.coming.com/WorkArea/downloadasset.aspx?id=47685> on Dec. 10, , pp. 1-3, 2013.
U.S. Non-Final Office Action issued in connection with Related U.S. Appl. No. 13/955,355 dated Sep. 25, 2014.
PCT Search Report and Written Opinion issued in connection with Related PCT Application No. PCT/US2014/054558 dated Nov. 20. 2014.
PCT Search Report and Written Opinion issued in connection with Related PCT Application No. PCT/US2014/054560 dated Dec. 5, 2014.
U.S. Non-Final Office Action issued in connection with Related U.S. Appl. No. 14/103,989 dated Jan. 2, 2015.
U.S. Non-Final Office Action issued in connection with Related U.S. Appl. No. 14/014,003 dated Feb. 2, 2015.
U.S. Non-Final Office Action issued in connection with Related U.S. Appl. No. 14/109,454 dated Feb. 23, 2015.
U.S. Non-Final Office Action issued in connection with Related U.S. Appl. No. 14/144,253 dated May 27, 2015.
PCT Search Report and Written Opinion issued in connection with Related PCT Application No. PCT/US2015/019468 dated May 28, 2015.
U.S. Non-Final Office Action issued in connection with Related U.S. Appl. No. 13/955,355 dated May 29, 2015.
U.S. Final Office Action issued in connection with Related U.S. Appl. No. 14/103,939 dated Jun. 9, 2015.
U.S. Final Office Action issued in connection with Related U.S. Appl. No. 14/109,454 dated Jul. 9, 2015.
U.S. Final Office Action issued in connection with Related U.S. Appl. No. 14/014,003 dated Aug. 28, 2015.
U.S. Non-Final Office Action issued in connection with Related U.S. Appl. No. 14/103,989 on Nov. 12, 2015.
U.S. Non-Final Office Action issued in connection with Related U.S. Appl. No. 14/109,454 dated Nov. 27, 2015.
U.S. Notice of Allowance issued in connection with Related U.S. Appl. No. 14/144,253 dated Dec. 7, 2015.
U.S. Final Office Action issued in connection with Related U.S. Appl. No. 13/955,355 dated Feb. 12, 2016.
Unofficial English Translation of Chinese Office Action issued in connection with Related CN Application No. 201410433906.2 dated Apr. 22, 2016.
U.S. Final Office Action issued in connection with Related U.S. Appl. No. 14/103,989 dated May 19, 2016.
International preliminary Report on Patentability issued in connection with Related PCT Application No. PCT/US2014/054560 dated Jun. 23, 2016.
International preliminary Report on Patentability issued in connection with Related PCT Application No. PCT/US2014/054558 dated Jul. 14, 2016.
U.S. Non-Final Office Action issued in connection with Related U.S. Appl. No. 13/955,355 dated Aug. 1, 2016.
International preliminary Report on Patentability issued in connection with Related PCT Application No. PCT/US2015/019468 dated Sep. 22, 2016.
Unofficial English Translation of Chinese Office Action issued in connection with Related CN Application No. 201410433906.2 dated Oct. 8, 2016.
U.S. Non-Final Office Action issued in connection with Related U.S. Appl. No. 15/122,187 dated Jan. 27, 2017.
U.S. Non-Final Office Action issued in connection with Related U.S. Appl. No. 14/103,989 dated Mar. 2, 2017.
Andrea Marie Schmitz et al., filed Aug. 29, 2015, U.S. Appl. No. 15/122,187.
Aaron Judy Couture et al., filed Aug. 29, 2013, U.S. Appl. No. 14/014,003.
Gauta Parthasarathy et al., filed Jul. 31, 2013, U.S. Appl. No. 13/955,355.
Aaron Judy Couture et al., filed Dec. 12, 2013, U.S. Appl. No. 14/103,989.
Aaron Judy Couture et al., filed Dec. 17, 2013, U.S. Appl. No. 14/109,454.
Ri-an Zhao et al., filed Dec. 30, 2013, U.S. Appl. No. 14/144,253.

\* cited by examiner

X-RAY DETECTOR HAVING IMPROVED NOISE PERFORMANCE

BACKGROUND

Digital X-ray detectors fabricated with continuous photodiodes have potential applications for low cost digital radiography as well as for rugged, light-weight and portable detectors on flexible substrates using organic photodiodes. Continuous photodiode digital x-ray detectors have increased fill factor and potentially higher quantum efficiency. One drawback to continuous photodiode digital X-ray detectors is that the structure of continuous photodiode can degrade electronic noise performance of x-ray detectors in comparison to patterned photodiode digital X-ray detectors.

SUMMARY

The inventors of the present disclosure recognized that one factor in electronic noise performance degradation associated with continuous photodiode digital X-ray detectors as compared to patterned photodiode digital X-ray detectors is additional capacitance added to the data readout line(s). The increase in capacitance can be attributed, at least in part, to direct coupling of the data readout line(s) in the transistor array to the un-patterned electrode of the continuous photodiode. The added loading caused by this coupling can increase the electronic noise of the data conversion electronics. Additionally, this load capacitance can increase the settling time for the readout of the data conversion electronics.

Exemplary embodiments of the present disclosure are directed to methods of fabricating detectors for imaging application and detectors for use in medical imagining systems. Exemplary embodiments can be implemented to control the load capacitance of the data readout lines to improve readout speed and reduce electronic noise compared to convention detectors including continuous photosensors. Exemplary embodiments control the load capacitance of the data readout lines by controlling a parasitic capacitance between the data readout lines and an electrode of the continuous photosensor of the detector by specifying a spatial relationship of the electrode to the data readout lines.

In one embodiment, a method of manufacturing an imaging detector is disclosed. The method includes depositing a plurality of transistors on a substrate; forming a data readout line with respect to the substrate, the data readout line having a length and a width and being connected to outputs of at least two of the plurality of transistors, depositing a continuous unpatterned photoelectric material of a photosensor over the data readout line. The photoelectric material is in in electrical communication with the plurality of transistors. The method also includes depositing an electrode of the photosensor over the photoelectric material to form an anode or a cathode of the photosensor and specifying a spatial relationship between the electrode and the data readout line across the width of the data readout line to control a capacitance of a parasitic capacitor between the electrode and the data readout line.

In another embodiment, a detector for an imaging device is disclosed. The detector includes transistors, a data readout line, a continuously formed unpatterned photoelectric material of a photosensor, an electrode of the photosensor, and a parasitic capacitor. The data readout line has a length and a width and is connected to the outputs of at least two of the transistors. The continuous unpatterned photoelectric material overlays the width of the data readout line and is in electrical communication with the at least two transistors. The electrode overlays the photoelectric material to form an anode or cathode of the photosensor. The parasitic capacitor formed between the electrode and the data readout line, a spatial relationship between the electrode and the data readout line across the width of the data readout line is specified to control a capacitance of the parasitic capacitor.

In yet another embodiment, an X-ray imaging system that includes a detector is disclosed. The detector is configured to generate electrical signals in response to incident X-rays and includes pixel areas, a continuously formed, unpatterned photoelectric material of a photosensor, an electrode of the photosensor, and a parasitic capacitance. Each of the pixel areas is associated with a transistor configured to output the electrical signals to one or more data readout lines. The continuous unpatterned photoelectric material overlays the pixel areas and the data readout lines. The photoelectric material is in electrical communication with at least two of the transistors. The electrode overlays and is in electrical communication with the photoelectric material to form an anode or cathode of the photosensor. The parasitic capacitor is formed between the electrode and the data readout line, and a spatial relationship between the electrode and the data readout line across the width of the data readout line is specified to control a capacitance of the capacitor.

In some embodiments, the electrode is deposited without patterning to overlay the data readout line and a dielectric is disposed to overlay the width of the data readout line and is disposed between the electrode and the data readout line. The dielectric can be disposed between the electrode and the data readout line before depositing the photoelectric material, after depositing the photoelectric material, and/or can be a portion of the electrode overlaying the width of the data readout line etched. In some embodiments, the electrode can be deposited according to a pattern to omit the electrode across the width of the data readout line.

In some embodiments, the transistors are arranged in an array having rows and columns. The length of data readout line can extend along the extent of one of the columns and can be connected to an output of each of the transistors in the column. The photoelectric material and the electrode can each be continuously formed as unitary structures over the array so that the photoelectric material and electrode substantially overlay the length and width of data readout line.

In some embodiments, the electrode can be deposited over the array so that a portion of the electrode that is vertically aligned over the length and width of data readout line is vertically offset from a portion of the electrode that is laterally offset from the data readout line. The dielectric can be positioned between the electrode and the data readout line to specify the vertical offset.

Any combination or permutation of embodiments is envisioned. Other objects and features will become apparent from the following detailed description considered in conjunction with the accompanying drawings. It is to be understood, however, that the drawings are designed as an illustration only and not as a definition of the limits of the invention.

DESCRIPTION OF EXEMPLARY EMBODIMENTS

Exemplary embodiments of the present disclosure are directed to imaging detectors, such as X-ray detectors, fabricated with continuous photosensors, wherein the photosensors overlay at least a portion of one or more data lines associated with transistors disposed at pixel areas in the detector. Exemplary embodiments improve the speed and the electronic noise of imagining detectors by controlling a data readout line capacitance created by a continuous photodiode.

Figure 1:
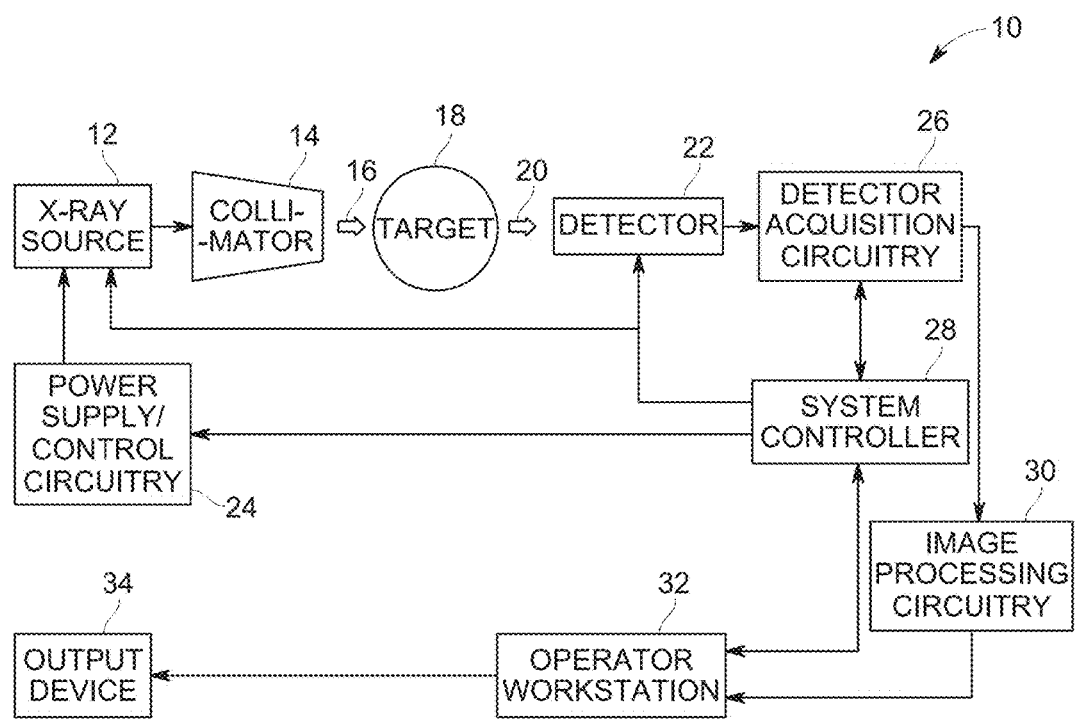
FIG. 1 illustrates an exemplary X-ray imaging system.

FIG. 1 illustrates an X-ray imaging system 10, which can be designed to acquire and process X-ray image data. The system 10 includes an X-ray source 12, a collimator 14, and a detector 22. The X-ray source 12 can be positioned adjacent to the collimator 14. In one embodiment, the X-ray source 12 is a low-energy source and is employed in low energy imaging techniques, such as fluoroscopic techniques, or the like. The collimator 14 can permit a stream of X-ray radiation 16 emitted by the X-ray source 12 to radiate towards a target 18, such as a human patient. A portion of the X-ray radiation is attenuated by the target 18 and at least some attenuated radiation 20 impacts the detector 22, such as a fluoroscopic detector.

As will be appreciated by one of ordinary skill in the art, the detector 22 may be based on scintillation, i.e., optical conversion, direct conversion, or on other techniques used in the generation of electrical signals based on incident radiation. For example, a scintillator-based detector converts X-ray photons incident on its surface to optical photons. These optical photons may then be converted to electrical signals by employing photosensor(s), e.g., photodiode(s). Conversely, a direct conversion detector directly generates electrical charges in response to incident X-ray photons. The electrical charges can be stored and read out from storage capacitors. As described in detail below, these electrical signals, regardless of the conversion technique employed, are acquired and processed to construct an image of the features (e.g., anatomy) within the target 18.

In the present embodiment, the X-ray source 12 is controlled by power supply/control circuitry 24 which furnishes both power and control signals for examination sequences. Moreover, detector 22 can be coupled to detector acquisition circuitry 26, which can be configured to receive electrical readout signals generated in the detector 22. Detector acquisition circuitry 26 may also execute various signal processing and filtration functions, such as, for initial adjustment of dynamic ranges, interleaving of digital, and so forth.

In the depicted exemplary embodiment, one or both of the power supply/control circuitry 24 and detector acquisition circuitry 26 can be responsive to signals from a system controller 28. In the present example, the system controller 28 can include signal processing circuitry, typically based upon a general purpose or application specific digital computer programmed to process signals according to one or more parameters. The system controller 28 may also include memory circuitry for storing programs and routines executed by the computer, as well as configuration parameters and image data, interface circuits, and so forth.

The system 10 can include image processing circuitry 30 configured to receive acquired projection data from the detector acquisition circuitry 26. The image processing circuitry 30 can be configured to process the acquired data to generate one or more images based on X-ray attenuation.

An operator workstation 32 can be communicatively coupled to the system controller 28 and/or the image processing circuitry 30 to allow an operator to initiate and configure X-ray imaging of a target and to view images generated from X-rays that impinge the detector 22. For example, the system controller 28 is in communication with the operator workstation 32 so that an operator, via one or more input devices associated with the operator workstation 32, may provide instructions or commands to the system controller 28.

Similarly, the image processing circuitry 30 can be in communication with the operator workstation 32 such that the operator workstation 32 can receive and display the output of the image processing circuitry 30 on an output device 34, such as a display or printer. The output device 34 may include standard or special purpose computer monitors and associated processing circuitry. In general, displays, printers, operator workstations, and similar devices supplied within the system may be local to the data acquisition components or may be remote from these components, such as elsewhere within an institution or hospital or in an entirely different location. Output devices and operator workstations that are remote from the data acquisition components may be operatively coupled to the image acquisition system via one or more configurable networks, such as the internet, virtual private networks, and so forth. As will be appreciated by one of ordinary skill in the art, though the system controller 28, image processing circuitry 30, and operator workstation 32 are shown distinct from one another in FIG. 1, these components may actually be embodied in a single processor-based computing system. Alternatively, some or all of these components may be present in distinct processor-based computing systems configured to communicate with one another. For example, the image processing circuitry 30 may be a component of a distinct reconstruction and viewing workstation.

Figure 2:
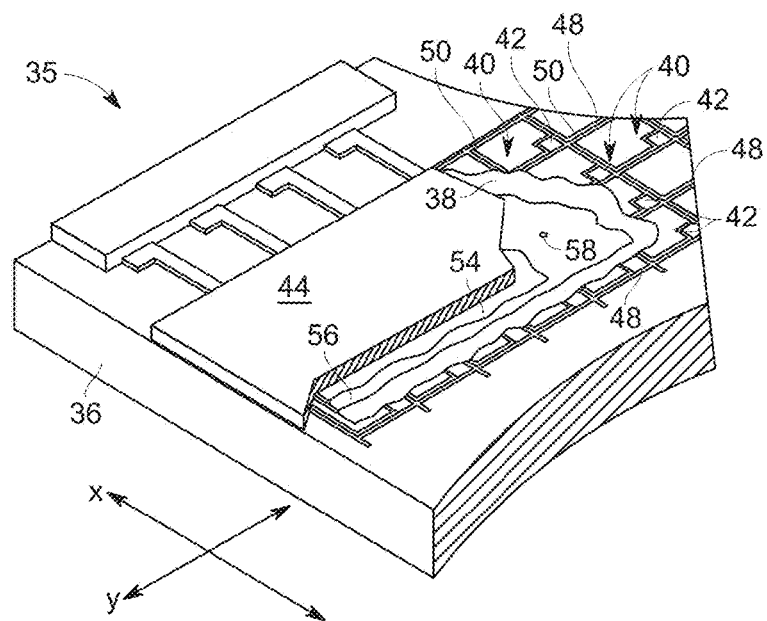
FIG. 2 is a cut away perspective view of an exemplary X-ray imaging detector.

FIG. 2 shows a perspective cut-away view of a physical arrangement of the components of an exemplary scintillation-based detector 35 suitable for use as the detector 22 depicted in FIG. 1. The detector 35 can include a glass substrate 36 upon which one or more components can be deposited. For example, in the present embodiment, the detector 35 can include a continuous photosensor element 38, transistors 42 (e.g., amorphous Silicon (a-Si) thin-film transistors (TFTs)), scintillator 44, data readout lines 48, scan lines 50, a conductive layer 54, and a dielectric layer 56 deposited with respect to the substrate 36. The components of the detector 35 can be composed of metallic, dielectric, organic, and/or inorganic materials, and can be fabricated with respect to the substrate 36 using various material deposition and removal techniques. Some examples of deposition techniques include, for example, chemical vapor deposition, physical vapor deposition, electrochemical deposition, stamping, printing, sputtering, and/or any other suitable deposition technique. Some examples of material removal techniques include lithography, etching (e.g., dry, wet, laser), sputtering, and/or any other suitable material removal techniques.

The detector 35 can include an array of pixel areas 40 on the glass substrate 36. Each of the pixel areas 40 can include at least one of the transistors 42 operatively coupled to at least one of the data readout lines 48, at least one of the scan lines 50, and to the photosensor 38. In the present embodiment, the transistors 42 are arranged in a two dimensional array having rows extending along an x-axis and columns extending along a y-axis, or vice versa. In some embodiments, the transistors 42 can be arranged in other configurations. For example, in some embodiments, the transistors can be arranged in a honeycomb pattern. The spatially density of the transistors 42 can determine a quantity of pixel areas 40 or pixels in the array, the physical dimensions of the array, as well as the pixel density or resolution of the detector 35.

Each of the data readout lines 48 can be in electrical communication with an output of at least one of the transistors 42. For example, each of the data readout lines can be associated with a row or column of transistors 42, and the output (e.g., source or drain) of each transistor 42 in the row or column can be in electrical communication with the same data readout line 48 such that there is one data readout line per row or column. The data readout lines 48 are susceptible to interference, such electronic noise from the surrounding environment, which can affect data signals being transmitted on the data readout lines 48. In exemplary embodiments, electronic noise can be introduced on the data readout lines 48 due to capacitive coupling to other conductive components in the detector 35. The data readout lines 48 can have a length and a width. In the present embodiment, the length of each of the data readout lines 48 extends along the y-axis and the width extends along the x-axis. The data readout lines 48 can be formed of a conductive material, such as a metal, and can be configured to facilitate transmission of electrical signals, corresponding to incident X-rays, to image processing circuitry (e.g., image processing circuitry 30).

The scan lines 50 can be in electrical communication with inputs (e.g., gates) of the transistors 42. For example, each of the scan lines 50 can be associated with a row or column of the transistors 42 and the input of each of the transistors 42 in the same row or column can be in electrical communication with one of the scan lines 50. Electrical signals transmitted on the scan lines 50 can be used to control the transistors to output data on the transistor's output such that each of the transistors connected to one of the scans lines 50 are configured to output data concurrently and data from each of the transistors 42 connected to one of the scan lines 50 flows through the data readout lines in parallel. The scan lines 50 can have a length and a width. In the present embodiment, the length of each of the scan lines 50 extends along the x-axis and the width extends along the y-axis. In exemplary embodiments, the scan lines 50 and the data readout lines 48 can extend perpendicularly to one another to form a grid. The scan lines 50 can be formed of a conductive material, such as a metal, and can be configured to facilitate transmission of electrical signals from a controller (e.g., system controller 28) to the input of the transistors 42.

The continuous photosensor 38 can be deposited over the transistors 42, data readout lines 48, and/or scan lines 50. The photosensor 38 can be formed from one or more photoelectric materials, such as one or more organic (i.e., carbon-based) and/or inorganic (i.e., non-carbon-based) materials that that convert light into electric current. In the present embodiment, the photoelectric material can extend continuously as a unitary structure over the array of transistors 42, the data readout lines 48, and the scan lines 50 such that the photoelectric material of the photosensor 38 substantially overlays and/or covers the pixel areas 40. By using a continuous unpatterned photoelectric material that is disposed over the transistor array, the density of the transistors 42 in the array, and therefore, the pixel density of the detector, can be increased as compared to patterned photosensors and/or a complexity of detector fabrication can be reduced.

Electrodes (e.g., electrical contacts) of the photosensor 38 can define anode(s) and cathode(s) of photosensor 38 and can be formed of a conductive material, such as, for example, indium tin oxide (ITO). For example, the photosensor 38 can include electrodes disposed on a first side of the photosensor 38 for electrically coupling the first side of the photosensor 38 to the transistors 42 and can include one or more electrodes disposed on a second opposing side of the photosensor 38 for electrically coupling the second side of the photosensor 38 to a bias voltage or vice versa. The electrodes of the photosensor 38 can form the anode(s) or cathode(s) of the photosensor 38. Exemplary embodiments of the continuous photosensor element 38 are described in more detail below with reference to FIGS. 3-10.

As illustrated in FIG. 2, a dielectric layer 56 can be disposed over the continuous photosensor 38 and a conductive layer 54 can be disposed on the dielectric layer 56. The dielectric layer 56 can include vias 58 to electrically couple the conductive layer 54 to the electrode(s) of the photosensor 38 to allow a common bias voltage to be applied at each pixel area 40 of the detector 35.

The scintillator 44 is disposed over the conductive layer 54 and generates the optical photons when exposed to X-rays. The optical photons emitted by the scintillator 44 are detected by the photosensor 38, which converts the optical photons to an electrical charge that can be output through the transistors 42 to the data readout lines 48.

Figure 3:
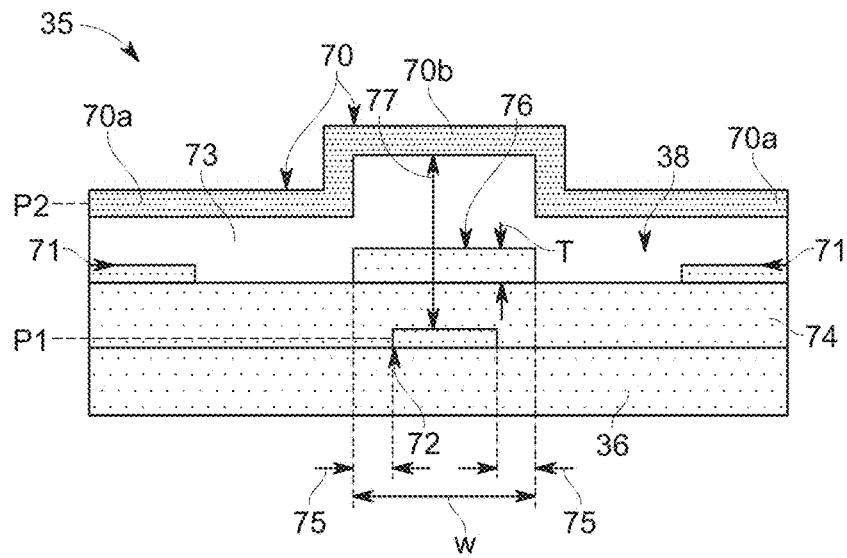
FIG. 3 is an exemplary side elevation view of a portion of an X-ray imaging detector in accordance with exemplary embodiments of the present disclosure.

FIG. 3 is a cross-sectional side elevation view of a portion of an exemplary embodiment of the detector 35 and illustrates an exemplary spatial relationship between one of the data readout lines (e.g., data readout lines 48) and continuously formed, unpatterned electrode 70 for an embodiment of the photosensor 38. The unpatterned electrode 70 and unpatterned photoelectric material 73 can overlay the patterned transistor array (e.g., transistors 42), the data readout lines, and the scan lines. The electrode 70 can have a unitary structure and can form the cathode or anode of the photosensor 38. In the present embodiment, the detector 35 can also include a set of electrodes 71 on an opposite side of the photosensor 38 such that the electrodes 71 oppose the electrode 70 and are spaced away from the electrode 70 by the photoelectric material 73. The electrodes 71 can provide electrical contacts between the photoelectric material and the transistors (e.g., transistor 42) of the detector. In exemplary embodiments, the electrode 70 and set of electrodes 71 can form the cathode and anodes, respectively, of the photosensor 38 or vice versa.

As shown in FIG. 3, a data readout line 72 (e.g., one of the data readout lines 48) is disposed with respect to the glass substrate 36, for example in plane P1 and a passivation (or dielectric) layer 74 is deposited over the data readout line 72. In addition to the passivation layer 74, another dielectric 76 is added before applying the photoelectric material 73 and the electrode 70. The dielectric 76 can be disposed along a length of the data readout line 72 and across a width of the data readout line 72 such that the dielectric 76 is vertically aligned with the data readout line 72. A width of the dielectric 76 can be equal to or exceed the width of the data readout line 72 (~7-10 μm wide) so that the sides of the dielectric 76 extend laterally to or beyond the sides of the data readout line 72 to create a lateral offset 75 between a portion 70a of the electrode 70 in a plane P2 and the data readout line 72 in P1. The plane P2 is spaced away from the plane P1 by a distance generally defined by a thickness of the passivation layer 74 and a thickness of the photoelectric material 73. In the present embodiment, the lateral offset 75 between the portion 70a of the electrode 70 and the data readout line 72 can be formed by the dielectric 76 to prevent overlapping parallel alignment of the electrode 70 in the plane P2 with the data readout line 72 and to control the indirect capacitive coupling between the data readout line 72 and the portion 70a of the electrode 70 in the plane P2. For example, in some embodiments, the width W of the dielectric 76 can extend beyond the sides of the data readout line 72 by a specified amount to prevent overlapping parallel alignment of the portion 70a of the electrode 70 with the data readout line 72 to control the indirect capacitive coupling between the data readout line 72 and the portion 70a of the electrode 70. In some embodiments, lateral offset 75 can be greater than zero. In some embodiments, the lateral offset 75 can be at least approximately one micron (1 um). In some embodiments, the lateral offset 75 can be at least one and a half microns (1.5 um). The greater the lateral offset 75, the less indirect capacitive coupling exists between the electrode 70 and the data readout line 72.

While FIG. 3 illustrate one of the data readout lines of an embodiment of the detector 35, those skilled in the art will recognize that the spatial relationship between the some, all, or none of the remaining data readout lines of the detector 35 and the electrode 70 can identical to the spatial relationship shown in FIG. 3.

A thickness T of the dielectric 76 can be specified to control the spatial relationship between the data readout line 72 and a portion 70b of the electrode 70 vertically aligned over the dielectric 76. For example, in some embodiments, the dielectric 76 can have a thickness T of approximately one micron (1 μm) or greater. The dielectric 76 can be printed or otherwise deposited in stripes directly over the data readout line 72. In some embodiments, printing can be achieved at low cost ink-jet patterning or other direct write methods. In some embodiments, the dielectric 76 can be thermally evaporated using a shadow mask to create a pattern. The photoelectric material 73 and electrode 70 can be coated continuously on top of the dielectric 76 without patterning, and the thickness T of dielectric 76 can be specified to control the direct capacitive coupling between the data readout line 72 and the portion 70b of the electrode 70 vertically aligned over the dielectric 76 to define a vertical offset 77 between the data readout 72 line and the portion 70b of the electrode 70 vertically aligned over the dielectric 76. The portions of the photoelectric material overlaying the data readout lines can be vertically offset with respect to the remainder of the photoelectric material by a distance that corresponds to the thickness T of the dielectric strips disposed over the data readout lines and the portions of the unpatterned electrode overlaying the data readout lines can be vertically offset with respect to the remainder of the unpatterned electrode by the distance that corresponds to the thickness T of the dielectric strips disposed over the data readout lines. An overall distance of the vertical offset 77 between the data readout line 72 and the portion 70b of the electrode 70 vertically aligned over the data readout line 72 can be measured perpendicularly to the data readout line 72. The vertical offset 77 specifies the spatial relationship between the data readout line 72 and the electrode 70 to control the parasitic capacitance between the data readout line 72 and the portion 70b of the electrode 70 vertically aligned over the data readout line 72.

Those skilled in the art will recognize that dielectrics 74 and 76 can be formed of the same or different materials. Furthermore, those skilled in the art will recognize that for embodiments in which the dielectrics are formed from the same material, the dielectrics 74 and 76 can be integrally deposited or can be deposited in sequence to build up a specified and/or desired thickness of the dielectric 76.

Figure 4:
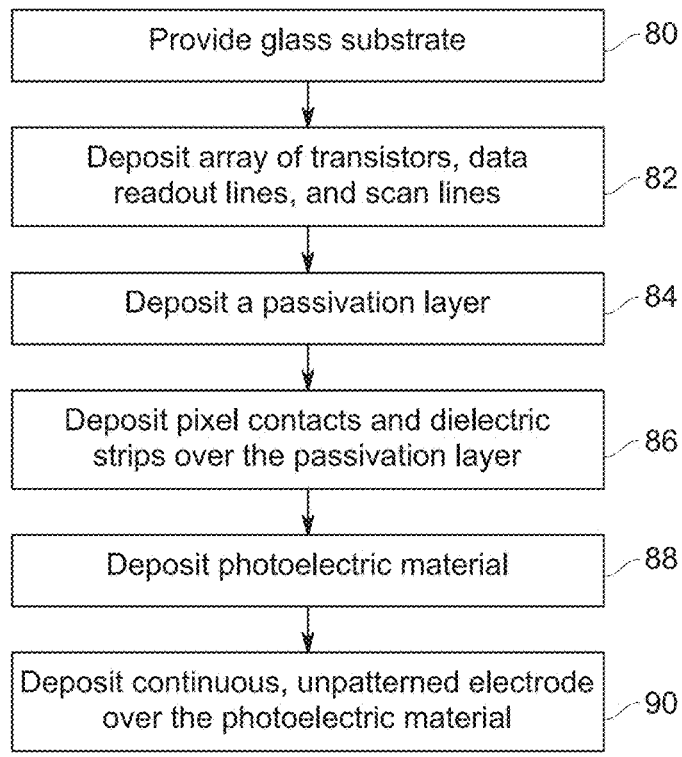
FIG. 4 is a flowchart of an exemplary process for fabricating an exemplary imaging detector consistent with FIG. 3 in accordance with embodiments of the present disclosure.

FIG. 4 is a flowchart of an exemplary process for fabricating an exemplary embodiment of the detector 35 shown in FIG. 3. In step 80, a glass substrate is provided and an array of patterned transistors, data readout lines, and scan lines are deposited in step 82. In step 84, a passivation layer is deposited over the array of transistors, data readout lines and scan lines. The transistors can be formed as thin film transistors. In step 86, pixel contacts (e.g., the set of electrodes 71) and dielectric strips are deposited over the passivation layer. Each of the pixel contacts can in electrical communication with one of the transistors in the array and can form separate electrodes that correspond to anodes or cathodes of a photosensor. The dielectric strips can have a specified width, length and thickness and can be disposed in strips overlaying along a length and width of the data readout lines. In some embodiments, the dielectric strips can be printed (e.g., ink-jet patterning) and/or can be thermally evaporated using a shadow mask to create a pattern. In step 88, a photosensitive material is deposited without patterning. The portions of the photosensitive material overlaying the data readout lines can be vertically offset with respect to the remainder of the photosensitive material by a distance that corresponds to the thickness of the dielectric strips disposed over the data readout lines. In step 90, a continuous, unpatterned electrode can be deposited over the photosensitive material. The portions of the unpatterned electrode overlaying the data readout lines can be vertically offset with respect to the remainder of the unpatterned electrode by a distance that corresponds to the thickness of the dielectric strips disposed over the data readout lines.

Figure 5:
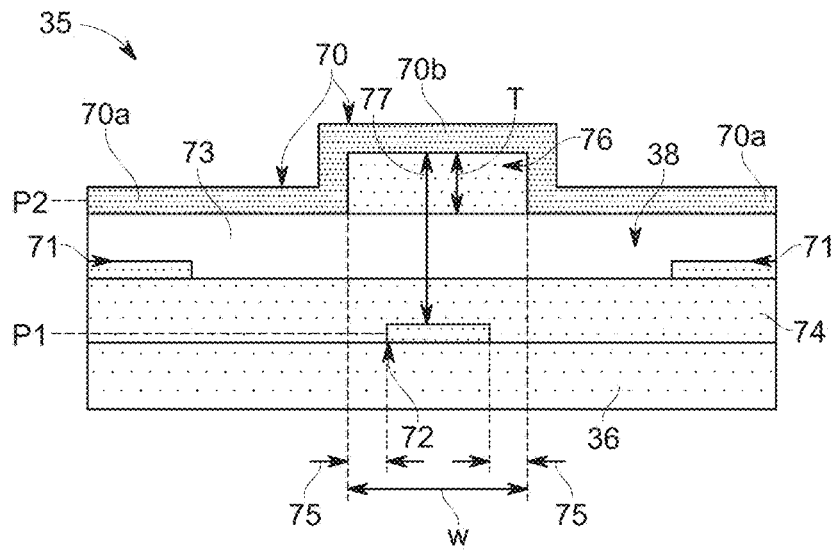
FIG. 5 is an exemplary side elevation view of a portion of another X-ray imaging detector in accordance with exemplary embodiments of the present disclosure.

FIG. 5 is a cross-sectional side elevation view of a portion of another exemplary embodiment of the detector 35 and illustrates an exemplary spatial relationship between one of the data readout lines (e.g., data readout lines 48) and continuously formed, unpatterned electrode 70 for an embodiment of the photosensor 38. The unpatterned electrode 70 and the unpatterned photoelectric material 73 can overlay the patterned transistor array (e.g., transistors 42). In the present embodiment, the detector 35 can also include the set electrodes 71 on an opposite side of the photoelectric material 73 such that the electrodes 71 oppose the electrode 70 and are spaced away from the electrode 70 by the photoelectric material 73.

As shown in FIG. 5, the data readout line 72 (e.g., one of the data readout lines 48) is disposed with respect to the glass substrate 36 and the passivation (or dielectric) layer 74 is deposited over the data readout line 72. The electrodes 71 and continuous photoelectric material 73 can be disposed on the passivation layer 74 such that the photoelectric is a unitary structure that overlays the data readout line 72. The dielectric 76 can be added after applying the after the photoelectric material, but before the continuous unpatterned electrode (e.g., the cathode or anode) of the photosensor 38 is deposited. The dielectric 76 can be disposed along a length of the data readout line 72 and across a width of the data readout line 72 such that the dielectric 76 is vertically aligned with the data readout line 72. A width of the dielectric 76 can be equal to or exceed the width of the data readout line 72 (~7-10 μm wide) so that the sides of the dielectric 76 extend laterally to or beyond the sides of the data readout line 72 to create the lateral offset 75 between the portion 70a of the electrode 70 in a plane P2 and the data readout line 72 in P1. The plane P2 is spaced away from the plane P1 by a distance generally defined by a thickness of the passivation layer 74 and a thickness of the photoelectric material 73. In the present embodiment, the lateral offset 75 between the electrode 70 and the data readout line 72 can be formed by the dielectric 76 to prevent overlapping parallel alignment of the portion 70a of the electrode 70 with the data readout line 72 and to control the indirect capacitive coupling between the data readout line 72 and the portion 70a of the electrode 70 in the plane P2. For example, in some embodiments, the width W of the dielectric 76 can extend beyond the sides of the data readout line 72 by a specified amount to prevent overlapping parallel alignment of the portion 70a electrode 70 in the plane P2 with the data readout line 72 to control the indirect capacitive coupling between the data readout line 72 and the portion 70a of the electrode 70. In some embodiments, the lateral offset 75 can be greater than zero. In some embodiments, the lateral offset 75 can be at least approximately one micron (1 um). In some embodiments, the lateral offset 75 can be at least one and a half microns (1.5 um). The greater the lateral offset 75, the less indirect capacitive coupling exists between the portion 70a of the electrode 70 and the data readout line 72.

While FIG. 5 illustrate one of the data readout lines of an embodiment of the detector 35, those skilled in the art will recognize that the spatial relationship between the some, all, or none of the remaining data readout lines of the detector 35 and the electrode 70 can identical to the spatial relationship shown in FIG. 5.

A thickness T of the dielectric 76 can be specified to control the spatial relationship between the data readout line 72 and the portion 70b of the electrode 70 vertically aligned over the dielectric 76. For example, in some embodiments, the dielectric 76 can have a thickness T of approximately one micron (1 μm) or greater. The dielectric 76 can be printed or otherwise deposited in stripes on the photosensor 38 and directly over the data line. In some embodiments, printing can be achieved at low cost ink-jet patterning or other direct write methods. In some embodiments, the dielectric 76 can be thermally evaporated using a shadow mask to create a pattern. The thickness of the dielectric 76, thus reducing the capacitive coupling between the data readout line 72 and the portion 70b of the electrode 70 vertically aligned over the dielectric 76 to define a vertical offset 77 between the data readout 72 line and the portion 70b of the electrode 70 vertically aligned over the dielectric 76. The distance of the vertical offset 77 between the data readout line 72 and the portion 70b of the electrode 70 vertically aligned over the data readout line 72 can be measured perpendicularly to the data readout line 72. The vertical offset 77 specifies the spatial relationship between the data readout line 72 and the portion 70b of the electrode 70 to control the parasitic capacitance between the data readout line 72 and the portion 70b of the electrode 70 vertically aligned over the data readout line 72. Those skilled in the art will recognize that dielectrics 74 and 76 can be formed of the same or different materials.

Figure 6:
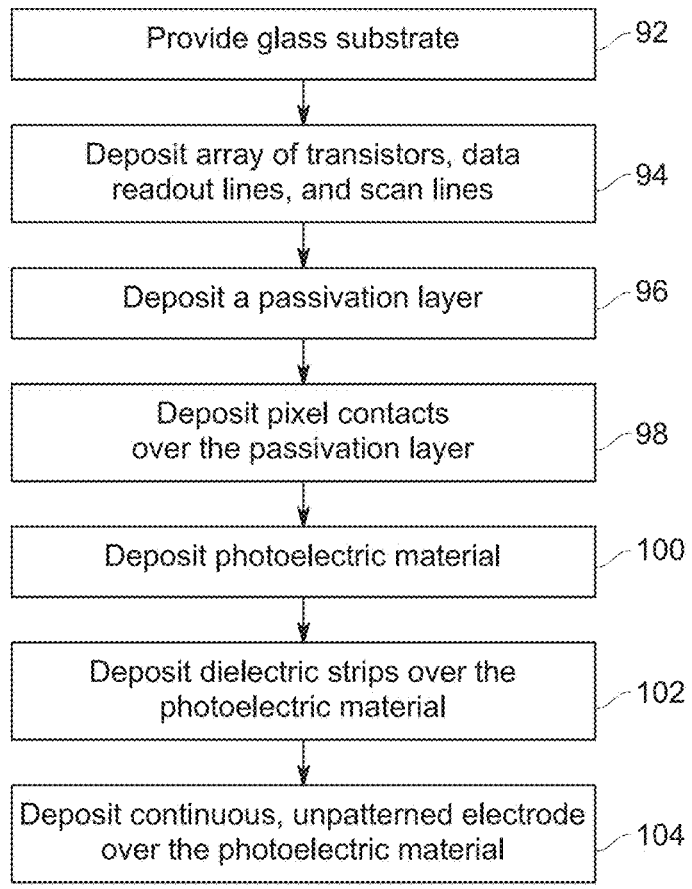
FIG. 6 is a flowchart of an exemplary process for fabricating an exemplary imaging detector consistent with FIG. 5 in accordance with embodiments of the present disclosure.

FIG. 6 is a flowchart of an exemplary process for fabricating an exemplary embodiment of the detector 35 shown in FIG. 5. In step 92, a glass substrate is provided and an array of patterned transistors, data readout lines, and scan lines are deposited in step 94. In step 96, a passivation layer is deposited over the array of transistors, data readout lines and scan lines. The transistors can be formed as thin film transistors. In step 98, pixel contacts (e.g., the set of electrodes 71) are deposited over the passivation layer. In step 100, the photoelectric material is deposited without patterning and in step 102 dielectric strips are deposited over the photoelectric material 73. The dielectric strips can have a specified width, length and thickness and can be disposed in strips overlaying a length and width of the data readout lines such that the dielectric strips are vertically aligned over the data readout lines. In some embodiments, the dielectric strips can be printed (e.g., ink-jet patterning) and/or can be thermally evaporated using a shadow mask to create a pattern. In step 104, a continuous, unpatterned electrode can be deposited over the photosensitive material and dielectric strips. The portions of the unpatterned electrode overlaying the data readout lines can be vertically offset with respect to the remainder of the unpatterned electrode by a distance that corresponds to the thickness of the dielectric strips disposed over the data readout lines.

Figure 7:
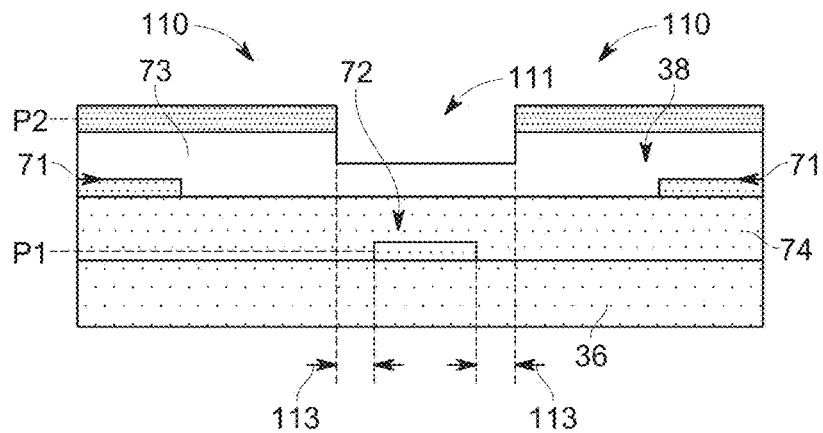
FIG. 7 is an exemplary side elevation view of a portion of yet another X-ray imaging detector in accordance with exemplary embodiments of the present disclosure.

FIG. 7 is a cross-sectional view of a portion of another exemplary embodiment of the detector 35 and illustrates an exemplary spatial relationship between one of the data readout lines (e.g., data readout lines 48) and an electrode 110 (e.g., a cathode or anode) of an embodiment of the photosensor 38. The unpatterned electrode 110 and the photoelectric material 73 of the photosensor 38 can overlay the transistor array (e.g., transistors 42). The electrode 110 can form the cathode or anode of the photosensor 38. In the present embodiment, the detector 35 can also include the set electrodes 71 on the opposite side of the photoelectric material such that the electrodes 71 oppose the electrode 110 and are spaced away from the electrode 110 by the photoelectric material 73.

As shown in FIG. 7, the data readout line 72 is disposed with respect to the glass substrate 36 in a plane P1 and passivation (or dielectric) layer 74 is deposited over the data readout line 72. The photosensor 38, including the continuous unpatterned photoelectric material 73 and a continuous unpatterned electrode 110 (e.g., the cathode or anode) of the photosensor 38, is deposited to overlay the data readout line 72. The electrode 110 is disposed in a plane P2 that is spaced away from the plane P1 by a distance generally defined by a thickness of the passivation layer 74 and a thickness of the photoelectric material 73. A portion 111 of the continuous unpatterned electrode 110 that is aligned vertically above the data readout line 72 has been removed along a length of the data readout line 72. A width of the removed portion 111 of the continuous unpatterned electrode 110 can be equal to or exceed the width of the data readout line 72 (~7-10 μm wide)

so that the detector 35 is devoid of the unpatterned continuous electrode 110 across at least the width of the data readout line 72 as well as along a length of the data readout line 72. While FIG. 7 illustrate one of the data readout lines of an embodiment of the detector 35, those skilled in the art will recognize that the spatial relationship between the some, all, or none of the remaining data readout lines of the detector 35 and the electrode 110 can identical to the spatial relationship shown in FIG. 7.

The width of the removed portion 111 of the unpatterned electrode 110 with respect to the width of the data readout line can be specified to control the spatial relationship between the data readout line 72 and the electrode 110. For example, in some embodiments, the width of the removed portion 111 of the electrode 110 can extend beyond the sides of the data readout line 72 by a specified amount to prevent overlapping parallel alignment of the electrode 110 with the data readout line 72 to control the indirect capacitive coupling between the data readout line 72 and the electrode 70. In the present embodiment, a lateral offset 113 between the electrode 110 and the data readout line 72 can be formed by the removed portion 111 to prevent overlapping parallel alignment of the electrode 110 with the data readout line 72 and to control the capacitive coupling between the data readout line 72 and the electrode 70. In some embodiments, lateral offset can be greater than zero. In some embodiments, the lateral offset 113 can be at least approximately one micron (1 um). In some embodiments, the lateral offset can be at least one and a half microns (1.5 um). The greater the lateral offset 113, the less indirect capacitive coupling exists between the electrode 110 and the data readout line.

Figure 8:
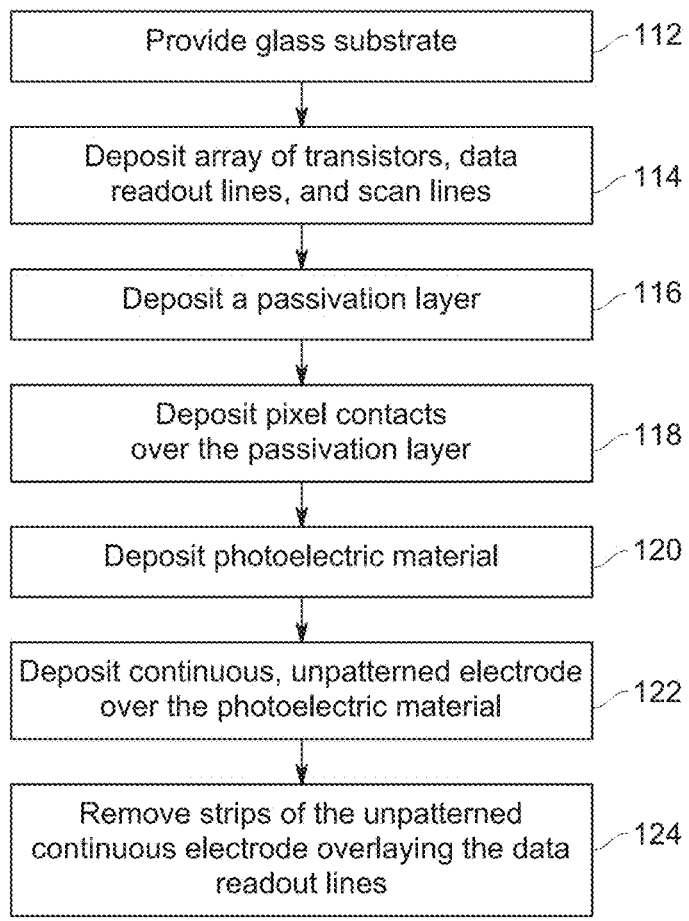
FIG. 8 is a flowchart of an exemplary process for fabricating an exemplary imaging detector consistent with FIG. 7 in accordance with embodiments of the present disclosure.

FIG. 8 is a flowchart of an exemplary process for fabricating an exemplary embodiment of the detector 35 shown in FIG. 7. In step 112, a glass substrate is provided and an array of patterned transistors, data readout lines, and scan lines are deposited in step 114. In step 116, a passivation layer is deposited over the array of transistors, data readout lines and scan lines. The transistors can be formed as thin film transistors. In step 118, pixel contacts (e.g., the set of electrodes 71) are deposited over the passivation layer. In step 120, the photoelectric material is deposited without patterning and in step 122, the continuous, unpatterned electrode is deposited over the photoelectric material such that the continuous unpatterned photoelectric material and the continuous unpatterned electrode overlay the patterned transistors, scan lines, and data lines of the detector.

In step 124, strips of the continuous unpatterned electrode that overlay the data readout lines are removed. As one example, portions of the continuous unpatterned electrode can selectively be removed over the data line region using a chemical etching process. As another example, portions of the continuous unpatterned electrode can be removed using high speed localized laser ablation with power and wavelength optimized so that the laser beam removes strips of the continuous unpatterned electrode that overlay the data readout lines. In some embodiments, the process of removing the strips of the continuous unpatterned electrodes can also include removal of at least a portion of the photoelectric material. After the strips of the continuous unpatterned electrode are removed, the detector is devoid of the continuous unpatterned electrode above the data readout lines along the lengths of the data readout lines and across the widths of the data readout lines.

Figure 9:
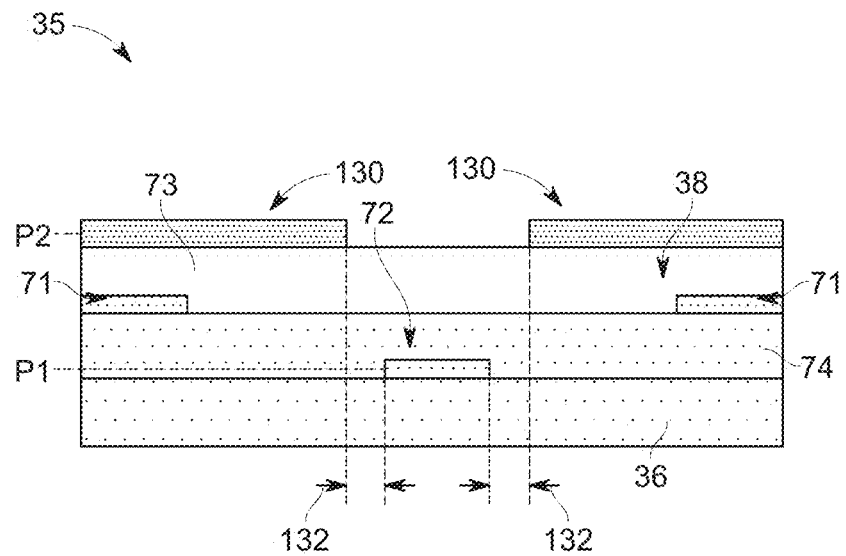
FIG. 9 is an exemplary side elevation view of a portion of still another X-ray imaging detector in accordance with exemplary embodiments of the present disclosure.

FIG. 9 is a cross-sectional view of a portion of another exemplary embodiment of the detector 35 and illustrates an exemplary spatial relationship between one of the data readout lines (e.g., data readout lines 48) and an electrode 130 (e.g., a cathode or anode) of an embodiment of the photoelectric material 73. The electrode 130 is disposed in a plane P2 that is spaced away from the plane P1 by a distance generally defined by a thickness of the passivation layer 74 and a thickness of the photoelectric material 73. The electrode 130 and the photoelectric material 73 can overlay the transistor array (e.g., transistors 42). The electrode 130 can form the cathode or anode of the photosensor 38. In the present embodiment, the detector 35 can also include the set electrodes 71 on the opposite side of the photoelectric material 73 such that the electrodes 71 oppose the electrode 130 and are spaced away from the electrode 130 by the photoelectric material 73.

As shown in FIG. 9, the data readout line 72 is disposed with respect to the glass substrate 36 in a plane P1 and passivation (or dielectric) layer 74 is deposited over the data readout line 72. The photoelectric material 73 is deposited without patterning to overlay the data readout line 72. The electrode 130 and the photoelectric material 73 can overlay the transistor array (e.g., transistors 42). The electrode 130 can be deposited according to a pattern such that the detector 35 is void of the electrode 130 along a length of the data readout line 72 and across a width of the data readout line 72. The pattern of the electrode 130 can be specified so that the electrode 130 with respect to the width and length of the data readout line can be to control the spatial relationship between the data readout line 72 and the electrode 130. For example, in some embodiments, a lateral offset 132 of the pattern of the electrode 130 can be specified to prevent overlapping parallel alignment of the electrode 130 with the data readout line 72 and to control the indirect capacitive coupling between the data readout line 72 and the electrode 70. While FIG. 9 illustrate one of the data readout lines of an embodiment of the detector 35, those skilled in the art will recognize that the spatial relationship between the some, all, or none of the remaining data readout lines of the detector 35 and the electrode 110 can identical to the spatial relationship shown in FIG. 9. In some embodiments, the lateral offset 132 can be greater than zero. In some embodiments, the lateral offset 132 can be at least approximately one micron (1 um). In some embodiments, the lateral offset can be at least one and a half microns (1.5 um). The greater the lateral offset 132, the less indirect capacitive coupling exists between the electrode 130 and the data readout line.

Figure 10:
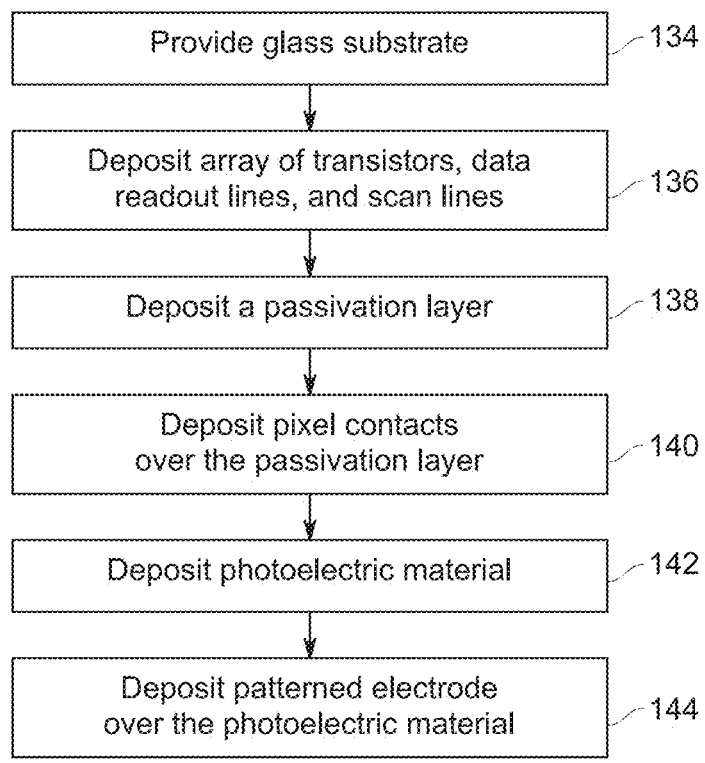
FIG. 10 is a flowchart of an exemplary process for fabricating an exemplary imaging detector consistent with FIG. 9 in accordance with embodiments of the present disclosure.

FIG. 10 is a flowchart of an exemplary process for fabricating an exemplary embodiment of the detector 35 shown in FIG. 9. In step 134, a glass substrate is provided and an array of patterned transistors, data readout lines, and scan lines are deposited in step 136. In step 138, a passivation layer is deposited over the array of transistors, data readout lines and scan lines. The transistors can be formed as thin film transistors. In step 140, pixel contacts (e.g., the set of electrodes 71) are deposited over the passivation layer. In step 142, a photoelectric material is deposited without patterning and in step 144, a patterned electrode is deposited over the photoelectric material. The patterned electrode can be deposited on the photoelectric material using masked evaporation. For example, mask(s) can be used in order to prevent deposition of the patterned electrode directly on top of the data readout lines. In some embodiment, the patterned electrode can be deposited using sputter deposition, thermal evaporation, ink jet printing, and/or any other suitable deposition techniques. For sputter deposition and thermal evaporation, patterning can be achieved by adding a shadow mask. For ink jet printing deposition, the patterned electrode can be selectively printed at the pixel regions of the detector without printing over the data readout lines.

In describing exemplary embodiments, specific terminology is used for the sake of clarity. For purposes of description, each specific term is intended to at least include all technical and functional equivalents that operate in a similar manner to accomplish a similar purpose. Additionally, in some instances where a particular exemplary embodiment includes a plurality of system elements, device components or method steps, those elements, components or steps may be replaced with a single element, component or step. Likewise, a single element, component or step may be replaced with a plurality of elements, components or steps that serve the same purpose. Moreover, while exemplary embodiments have been shown and described with references to particular embodiments thereof, those of ordinary skill in the art will understand that various substitutions and alterations in form and detail may be made therein without departing from the scope of the invention. Further still, other aspects, functions and advantages are also within the scope of the invention.

Exemplary flowcharts are provided herein for illustrative purposes and are non-limiting examples of methods. One of ordinary skill in the art will recognize that exemplary methods may include more or fewer steps than those illustrated in the exemplary flowcharts, and that the steps in the exemplary flowcharts may be performed in a different order than the order shown in the illustrative flowcharts.

The invention claimed is:

1. A detector for an imaging device comprising:
a plurality of transistors;
a data readout line being in electrical communications with at least two of the plurality of transistors, the data line having a length and a width and residing in a first plane;
a continuous unpatterned photoelectric material deposited without a pattern and formed as a unitary structure overlaying the entire width of the data readout line and in electrical communication with the at least two transistors;
a passivation layer directly overlaying the data readout line;
an electrode overlaying the photoelectric material, the electrode residing in a second plane;
a dielectric disposed between the passivation layer and the electrode, wherein the dielectric is physically separate from the passivation layer that continuously and directly overlays the data readout line;
wherein the electrode is laterally offset from the data readout line; and
wherein contours of the dielectric disposed between the passivation layer and the electrode define a vertical offset between a first portion of the electrode that overlays the data readout line and a second portion of the electrode.

2. The detector of claim 1, wherein the electrode is a continuous unpatterned electrode.

3. The detector of claim 2, wherein the dielectric is positioned between the electrode and the data readout line to specify a spatial relationship between the electrode and the data readout line, the dielectric overlaying the width of the data readout line.

4. The detector of claim 3, wherein the dielectric is disposed between the photoelectric material and the data readout line.

5. The detector of claim 3, wherein the dielectric is disposed between the electrode and the photoelectric material.

6. The detector of claim 1, wherein the electrode is deposited according to a pattern so that the electrode is omitted across the width of the data readout line to specify a spatial relationship between the electrode and the data readout line.

7. The detector of claim 1, wherein the electrode overlaying the width of the data readout line is removed by an etching process to create the lateral offset.

8. An X-ray imaging system comprising:
a detector configured to generate electrical signals in response to incident X-rays, the detector comprising:
a plurality of pixels areas, each of the pixel areas being associated with a transistor configured to output the electrical signals to one or more data readout lines, the one or more data readout lines residing in a first plane;
a continuous unpatterned photoelectric material deposited without a pattern and formed as a unitary structure overlaying the plurality of pixel areas and the data readout lines, the photoelectric material being in electrical communication with at least two of the transistors;
a passivation layer directly overlaying the one or more data readout lines;
an electrode overlaying and in electrical communication with the photoelectric material, the electrode residing in a second plane,
wherein the electrode is laterally offset from the data readout line;
a dielectric disposed between the passivation layer and the electrode, wherein the dielectric is physically separate from the passivation layer that continuously and directly overlays the data readout line; and
wherein contours of the dielectric disposed between the passivation layer and the electrode define a vertical offset between a first portion of the electrode that overlays the data readout line and a second portion of the electrode.

9. The detector of claim 1, wherein the continuous unpatterned photoelectric material formed as a unitary structure overlays the plurality of transistors.

10. The detector of claim 1, wherein the dielectric disposed between the passivation layer and the electrode vertically offsets the first portion of the electrode from the second portion of the electrode by a distance that corresponds to a thickness of the dielectric.

11. The detector of claim 1, wherein the dielectric has a length less than the electrode; and the first portion of the electrode is aligned over the dielectric and the second portion of the electrode is not aligned over the dielectric.

* * * * *